United States Patent
Jo et al.

(10) Patent No.: US 7,723,134 B2
(45) Date of Patent: May 25, 2010

(54) METHOD OF MANUFACTURING DISPLAY DEVICE

(75) Inventors: Gyoo-Chul Jo, Gyeonggi-do (KR);
Chang-Soo Kim, Gyeonggi-do (KR);
Yun-Sik Ham, Gyeonggi-do (KR)

(73) Assignee: Samsung Mobile Display Co., Ltd., Yongin, Gyunggi-do (KR)

( * ) Notice: Subject to any disclaimer, the term of this patent is extended or adjusted under 35 U.S.C. 154(b) by 0 days.

(21) Appl. No.: 12/021,983

(22) Filed: Jan. 29, 2008

(65) Prior Publication Data

US 2008/0218091 A1 Sep. 11, 2008

(30) Foreign Application Priority Data

Mar. 5, 2007 (KR) .................. 10-2007-0021503

(51) Int. Cl.
*H01L 21/00* (2006.01)

(52) U.S. Cl. .................. 438/30; 438/149; 349/113; 349/43; 349/42; 257/E27.123

(58) Field of Classification Search .................. 438/30, 438/149; 349/113, 42, 43; 257/E27.123
See application file for complete search history.

(56) References Cited

U.S. PATENT DOCUMENTS

| 6,947,108 B2 * | 9/2005 | Chae ........................... 349/113 |
| 7,554,618 B2 * | 6/2009 | Ishii et al. ..................... 349/38 |
| 2005/0200778 A1 * | 9/2005 | Kim et al. .................... 349/114 |
| 2007/0126942 A1 * | 6/2007 | Ishii et al. ..................... 349/38 |

FOREIGN PATENT DOCUMENTS

| JP | 06-235929 A | 8/1994 |
| JP | 07-084270 A | 3/1995 |
| JP | 10-062815 A | 3/1998 |
| JP | 10-173198 A | 6/1998 |
| JP | 11-242238 A | 9/1999 |
| JP | 2000-347220 A | 12/2000 |
| JP | 2002-236459 A | 8/2002 |
| JP | 2003-043508 A | 2/2003 |
| JP | 2005-128310 A | 5/2005 |
| JP | 2005-215478 A | 8/2005 |
| JP | 2005-242372 A | 9/2005 |
| KR | 10-2004-0042861 | 5/2004 |
| KR | 10-2006-0040427 | 5/2006 |
| KR | 10-2006-0072675 | 6/2006 |
| KR | 10-2006-0104531 | 10/2006 |

* cited by examiner

*Primary Examiner*—George Fourson
*Assistant Examiner*—John M Parker
(74) *Attorney, Agent, or Firm*—Knobbe Martens Olson & Bear LLP

(57) ABSTRACT

A method of manufacturing a display device reduces damage to pad electrodes. The method includes: forming a thin film transistor in a pixel area on a first substrate and simultaneously forming a pad electrode in a pad area on the first substrate; forming a first pixel electrode connected to the thin film transistor and simultaneously forming a pad protection layer covering the pad electrode; and exposing the pad electrode by removing the pad protection layer.

15 Claims, 10 Drawing Sheets

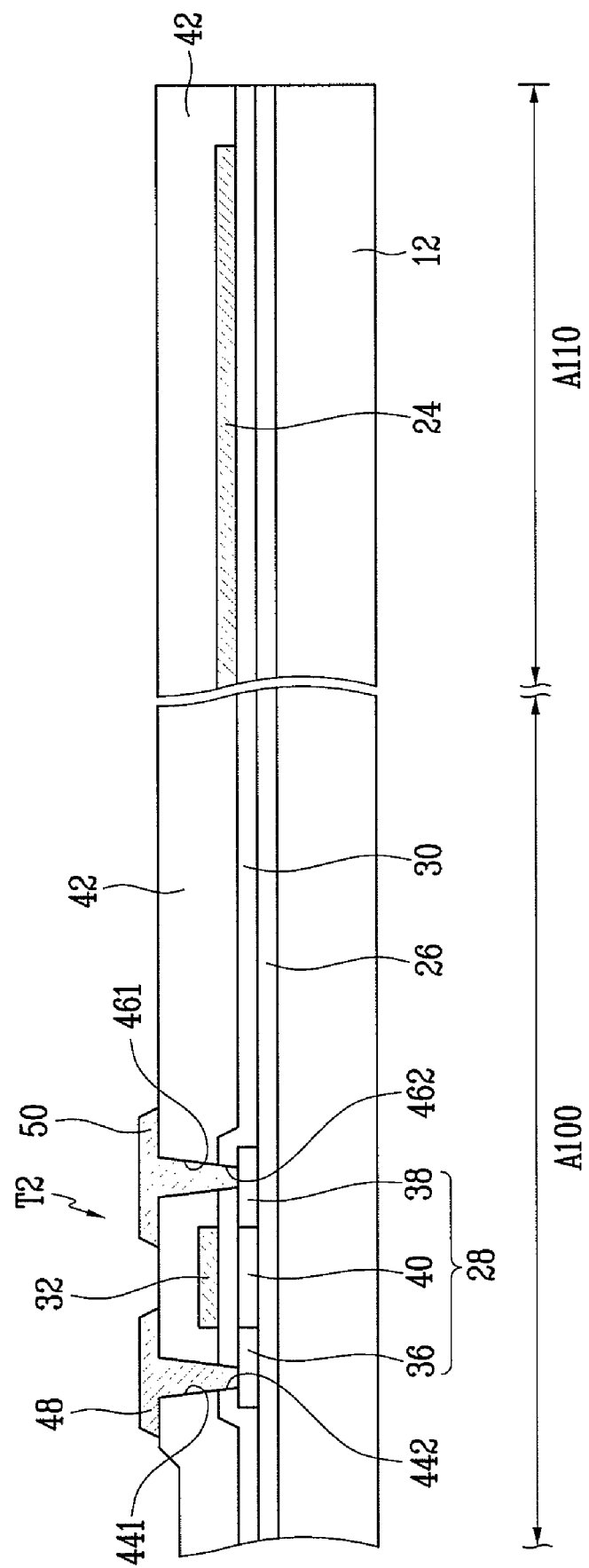

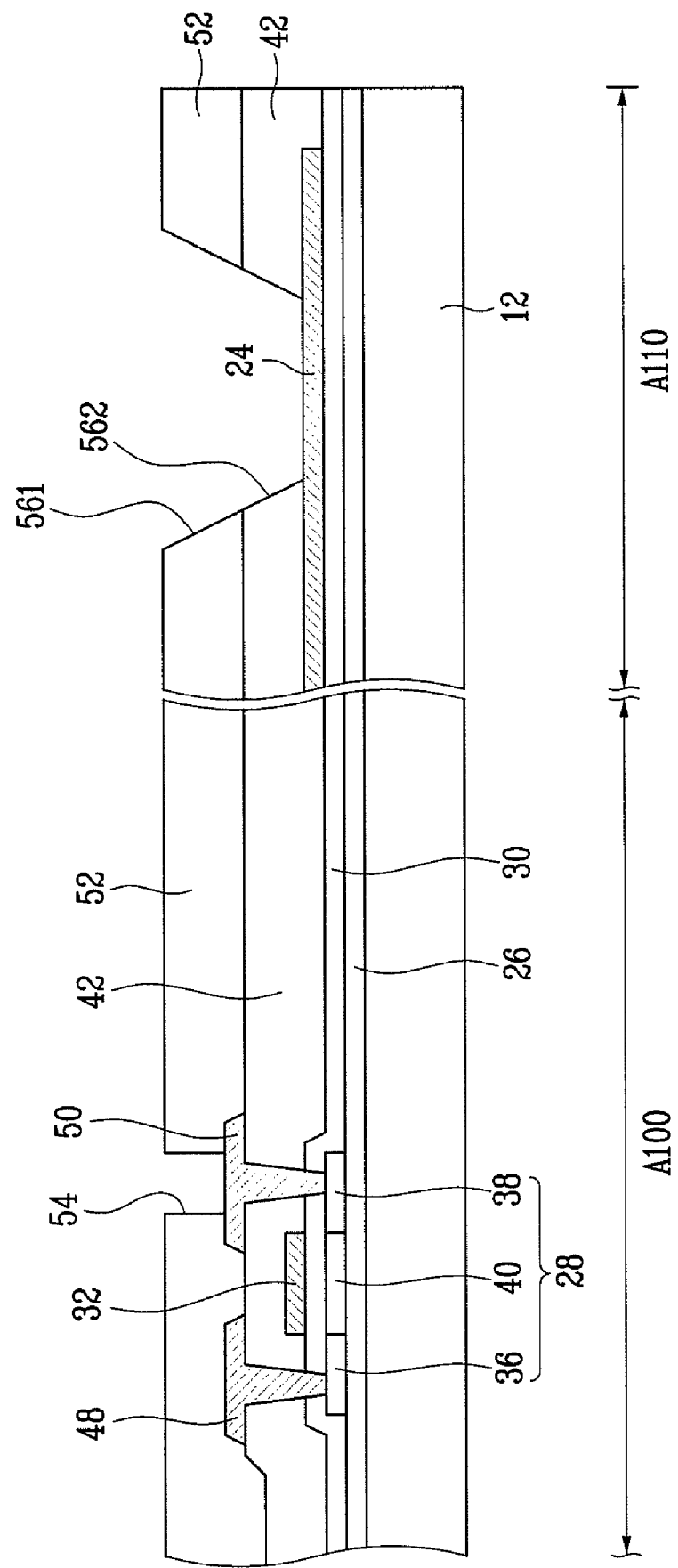

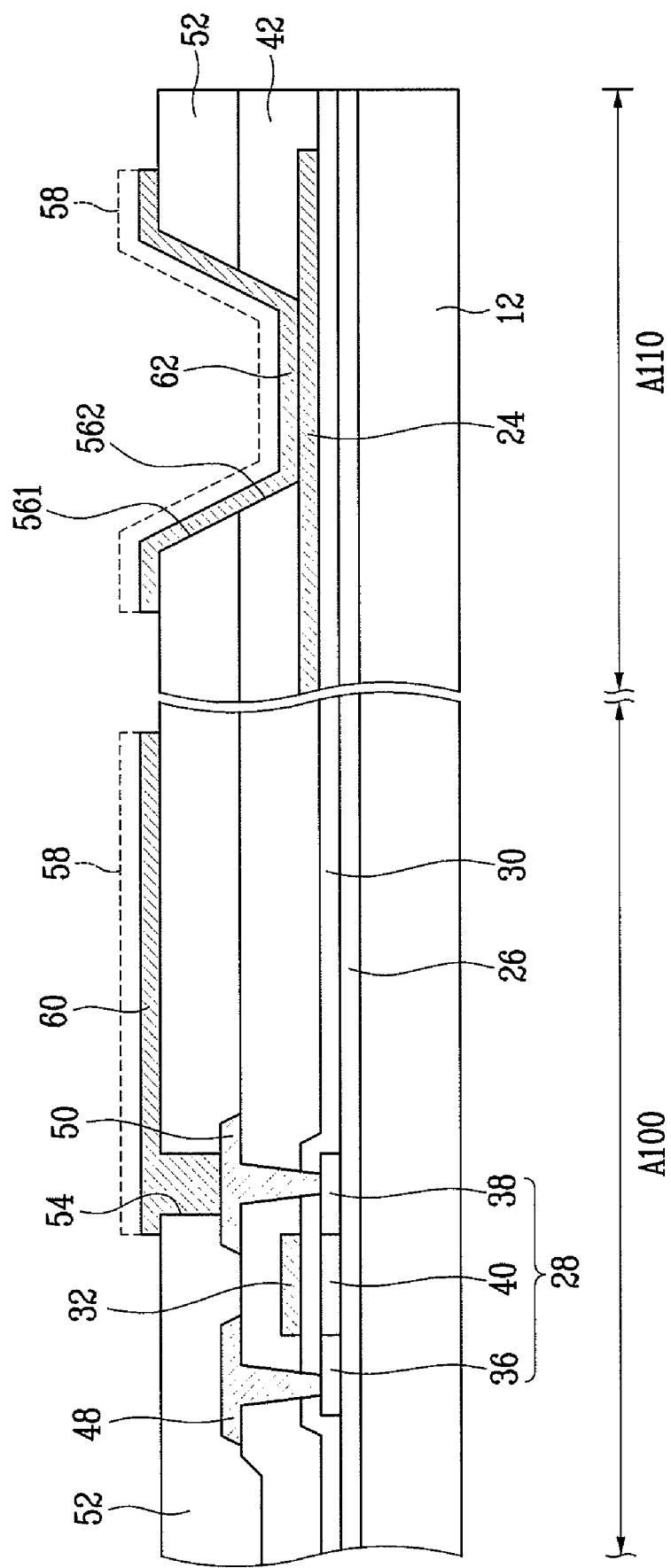

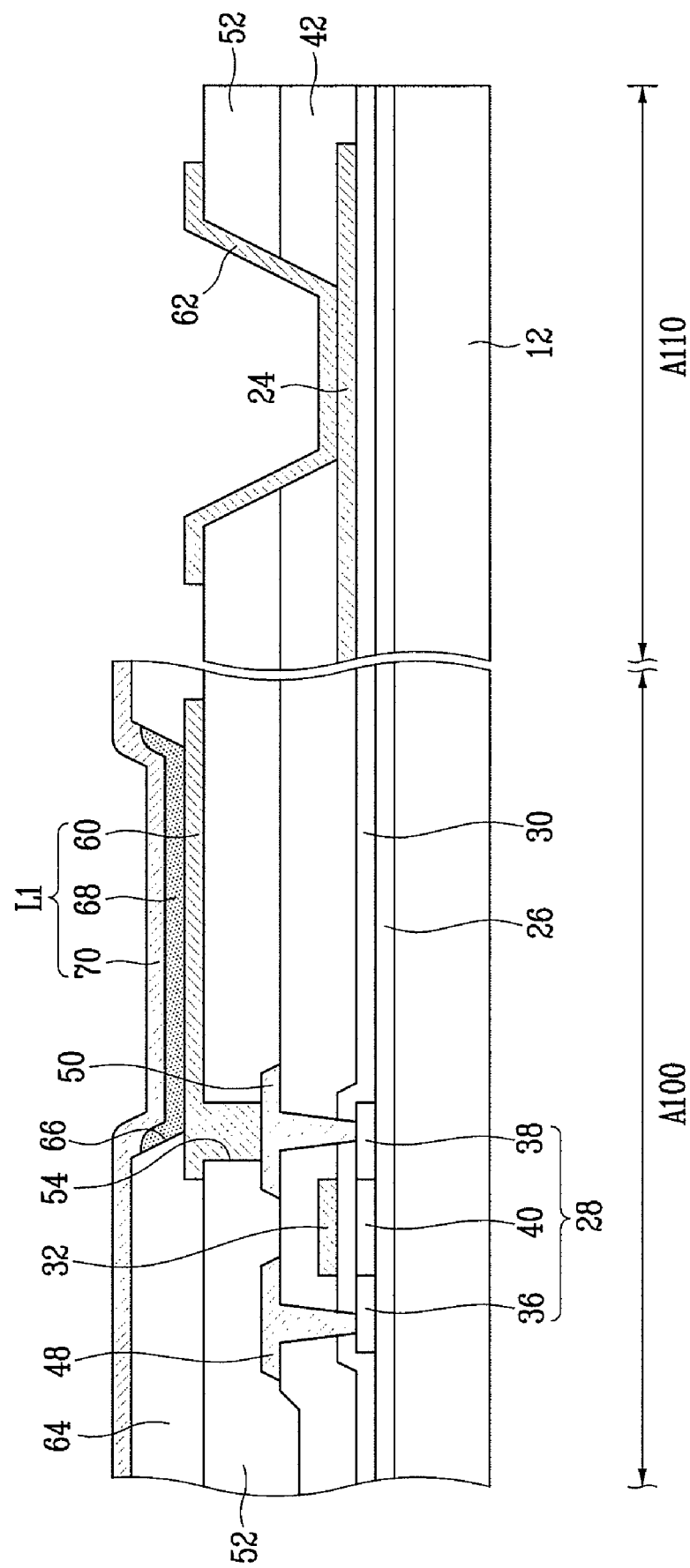

METHOD OF MANUFACTURING DISPLAY DEVICE

CROSS-REFERENCE TO RELATED APPLICATION

This application claims priority to and the benefit of Korean Patent Application No. 10-2007-0021503 filed in the Korean Intellectual Property Office on Mar. 5, 2007, the entire content of which is incorporated herein by reference.

BACKGROUND

1. Technical Field

The present disclosure relates to a method of manufacturing a display device, and more particularly, to a method of manufacturing an organic light emitting diode (OLED) display capable of suppressing damage to pad electrodes.

2. Description of the Related Art

An organic light emitting diode (OLED) display displays an image by driving an organic light emitting element. The organic light emitting element includes an anode (e.g., hole injection electrode), an organic emission layer, and a cathode (e.g., electron injection electrode). When electrons and holes are injected to the organic emission layer respectively by the anode and the cathode, an exciton, which is a combination of an electron and a hole, is generated in the organic emission layer. Light is emitted by energy produced when the exciton relaxes from an exited state to a ground state.

An active matrix type OLED display generally has a substrate including a pixel area and a pad area, wherein an image is displayed in the pixel area, and the pad area is formed outside the pixel area. An external module is mounted on pad electrodes formed in the pad area. In the pixel area, red, green, and blue organic light emitting elements are disposed in a matrix form. At least two thin film transistors (hereinafter, referred as "TFTs") are provided for each organic light emitting element so that each organic light emitting element can be independently controlled.

In general, the OLED display is manufactured by using processes of: (1) forming a TFT including an active layer, a gate electrode, a source electrode, and a drain electrode on a substrate; (2) forming a planarization layer to cover the TFT; (3) forming a first pixel electrode on the planarization layer coupled to the drain electrode; and (4) forming an organic emission layer and a second pixel electrode on the first pixel electrode. The pad electrodes are formed in the pad area in the process of forming the TFT. The pad electrodes are covered with at least one insulation layer. Further, the pad electrodes are exposed on the substrate through an opening formed in the insulation layer(s).

In the aforementioned manufacturing processes, however, the first pixel electrode is formed in a state in which the pad electrodes are exposed. Therefore, the pad electrodes may be damaged by a first pixel electrode etchant. That is, if the pad electrodes comprise a material that is etched by the first pixel electrode etchant, the pad electrodes may be etched during etching of the first pixel electrode, which may cause disconnection of the pad electrodes.

SUMMARY OF THE INVENTION

One object is to provide a method of manufacturing a display device with reduced damage to the pad electrodes.

Some embodiments provide a method of manufacturing a display device, comprising: forming a thin film transistor in a pixel area on a first substrate and simultaneously forming a pad electrode in a pad area on the first substrate; forming a first pixel electrode connected to the thin film transistor and simultaneously forming a pad protection layer covering the pad electrode; and exposing the pad electrode by removing the pad protection layer.

The first pixel electrode may contain Ag. The first pixel electrode may include a first transparent conductive layer, a reflective layer, and a second transparent conductive layer, and the reflective layer may contain Ag.

An organic emission layer and a second pixel electrode may be further formed on the first pixel electrode. A second substrate may be bonded onto the first substrate before the pad protection layer is removed. The pad protection layer may be removed by wet etching.

The forming of a thin film transistor may comprise: forming sequentially an active layer, a gate insulating layer, and a gate electrode on the first substrate; forming an interlayer insulating layer on the gate insulating layer so as to cover the gate electrode; forming a source electrode and a drain electrode on the interlayer insulating layer.

The gate electrode and the pad electrode may be simultaneously formed with the same material. In this case, the pad electrode may contain any one of components selected from the group consisting of MoW, Al, Cr, and Al/Cr. On the other hand, the source electrode, the drain electrode, and the pad electrode may be simultaneously formed with the same material. In this case, the pad electrode may contain any one of components selected from the group consisting of Ti, Ti-alloy, Ta, and Ta-alloy.

Some embodiments provide a method for manufacturing a display device, comprising: forming a thin film transistor in a pixel area on a first substrate and simultaneously forming a pad electrode in a pad area on the first substrate; forming a first pixel electrode coupled to the thin film transistor and simultaneously forming a pad protection layer covering the pad electrode; and exposing the pad electrode by removing the pad protection layer.

In some embodiments, the first pixel electrode comprises Ag. In some embodiments, the first pixel electrode includes a first transparent conductive layer, a reflective layer, and a second transparent conductive layer, and the reflective layer comprises Ag.

Some embodiments further comprise forming an organic emission layer and a second pixel electrode on the first pixel electrode.

Some embodiments further comprise bonding a second substrate onto the first substrate before the pad protection layer is removed. In some embodiments, the pad protection layer is removed by wet etching.

In some embodiments, forming of the thin film transistor comprises: forming sequentially, an active layer, a gate insulating layer, and a gate electrode on the first substrate; forming an interlayer insulating layer on the gate insulating layer, covering the gate electrode; and forming a source electrode and a drain electrode on the interlayer insulating layer.

In some embodiments, the gate electrode and the pad electrode are substantially simultaneously formed from the same material. In some embodiments, the pad electrode comprises at least one of MoW, Al, Cr, and Al/Cr.

Some embodiments further comprise: forming a planarization layer on the thin film transistor and the pad electrode; forming a via-hole by patterning the planarization layer, thereby exposes the drain electrode; and forming a pad contact hole by patterning the planarization layer and the interlayer insulating layer, thereby exposing the pad electrode.

In some embodiments, the source electrode, the drain electrode, and the pad electrode are substantially simultaneously formed from the same material. In some embodiments, the pad electrode comprises at least one of Ti, Ti-alloy, Ta, and Ta-alloy. the Ti-alloy comprises TiN, and the Ta-alloy comprises TaN.

Some embodiments further comprise: forming the planarization layer on the thin film transistor and the pad electrode; and forming the via-hole, which exposes the drain electrode, and the pad contact hole, which exposes the pad electrode, by patterning the planarization layer.

Some embodiments provide a display device manufactured using the disclosed method. In some embodiments, the display device is an organic light emitting diode (OLED) display.

BRIEF DESCRIPTION OF THE DRAWINGS

FIGS. 2A to 2G are cross-sectional views of a method of manufacturing an OLED display according to a first embodiment.

DETAILED DESCRIPTION OF CERTAIN EMBODIMENTS

The certain embodiments will be described more fully hereinafter with reference to the accompanying drawings, in which exemplary embodiments of the invention are shown. As those skilled in the art would realize, the described embodiments may be modified in various different ways, all without departing from the spirit of scope of the present disclosure. It will be understood that when a first element is referred to as being "on" a second element, the first element can be directly on the second element, or one or more intervening third elements may be present therebetween.

Figure 1:
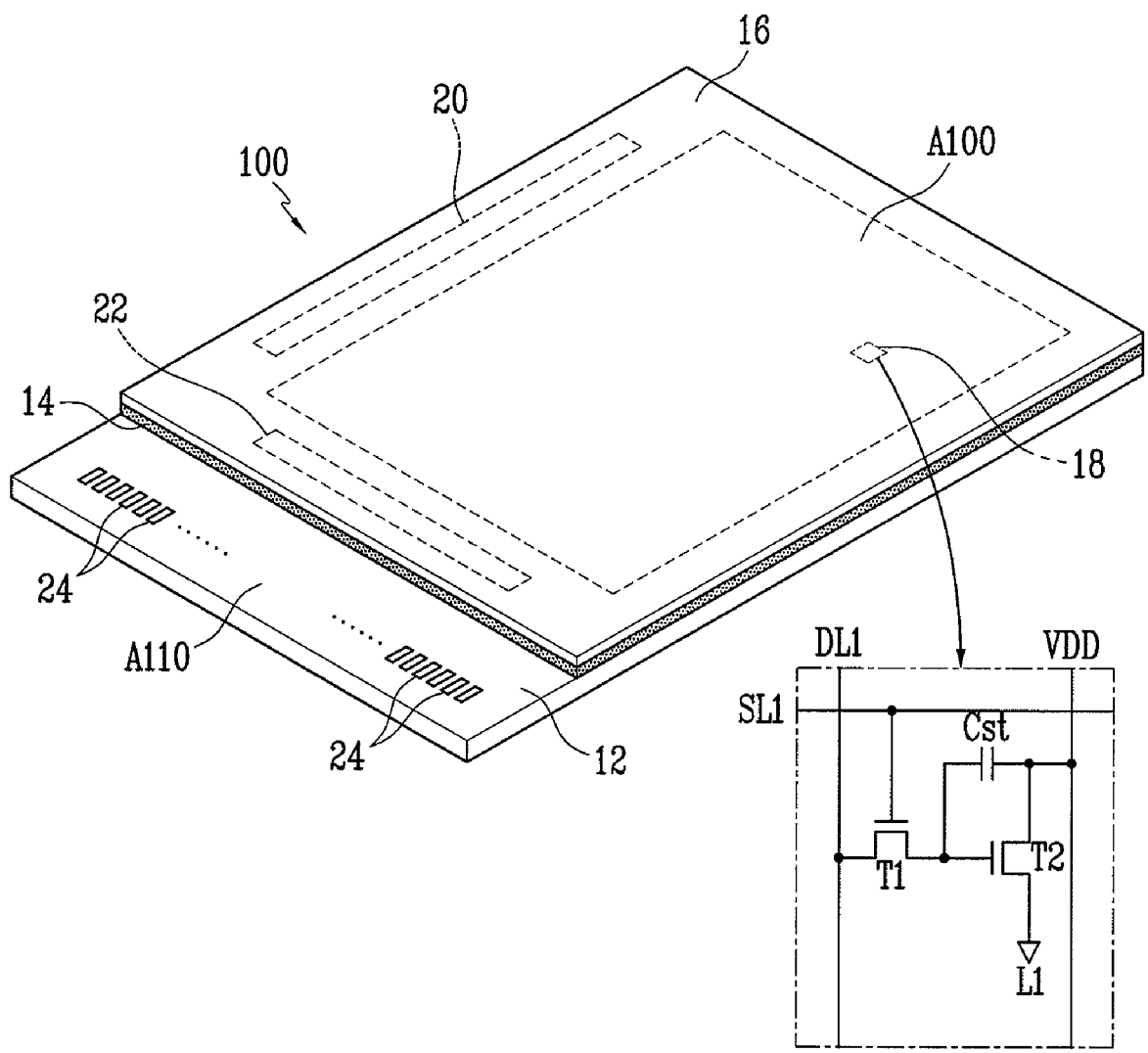
FIG. 1 is a perspective view of an embodiment of an organic light emitting diode (OLED) display.

FIG. 1 is a perspective view of an embodiment of a display device 100 according to an embodiment, in which an organic light emitting diode (OLED) display is shown as an example. Referring to FIG. 1, an OLED display 100 includes a first substrate 12 and a second substrate 16, which is bonded with the first substrate 12 by the use of a sealant 14. A pixel area A100 in which an image is displayed is formed within the inner perimeter of the sealant 14 where the first substrate 12 and the second substrate 16 face each other. A pad area A110 is formed in an outer portion of the sealant 14 where the first substrate 12 is exposed. The second substrate 16 includes a moisture absorbent (not shown).

A plurality of sub-pixels 18 are disposed in the pixel area A100 on the first substrate 12 in a matrix form. A scan driver 20 and a data driver 22 are disposed outside the pixel area A100 and are configured to drive the sub-pixels 18.

Pad electrodes 24 are disposed in the pad area A110 on the first substrate 12 configured to transmit an electrical signal to the scan driver 20 and the data driver 22. An external module (e.g., chip on glass (COG) or flexible printed circuit (FPC) film, etc., not shown) is mounted on the pad electrodes 24.

As shown in the inset, each sub-pixel 18 comprises a light emitting element L1 and a driving circuit. The light emitting element L1 includes an anode, an organic emission layer, and a cathode. For example, the driving circuit may include a first switching thin film transistor (hereinafter, referred to as "first TFT") T1, a second driving thin film transistor (hereinafter, referred to as "second TFT") T2, and a storage capacitor Cst. The structure of sub-pixel 18 is not limited thereto, however.

The first TFT T1 is coupled to a scan line SL1 and a data line DL1. Further, the first TFT T1 transmits a data voltage input from the data line DL1 to the second TFT T2 according to a switching voltage input to the scan line SL1. The storage capacitor Cst is coupled to the first TFT T1 and a power line VDD. Further, the storage capacitor Cst stores a voltage Vgs corresponding to a voltage difference between a voltage supplied from the first TFT T1 and a voltage supplied to the power line VDD.

The second TFT T2 is coupled to the power line VDD and the storage capacitor Cst so as to provide an output current to the light emitting element L1, wherein the output voltage is proportional to a square of a voltage difference between the voltage Vgs stored in the storage capacitor Cst and a threshold voltage Vth. The light emitting element L1 emits light according to the output current.

Hereinafter, a method of manufacturing an OLED display according to a first embodiment will be described with reference to FIGS. 2A to 2G. FIGS. 2A to 2F illustrate in cross section a sub-pixel in a pixel area and a pad electrode in a pad area of an OLED display. Regarding the sub-pixel in the pixel area, only the second TFT is shown among the aforementioned first and second TFTs. FIG. 2G selectively illustrates only the pad electrode in the pad area.

Figure 2A:
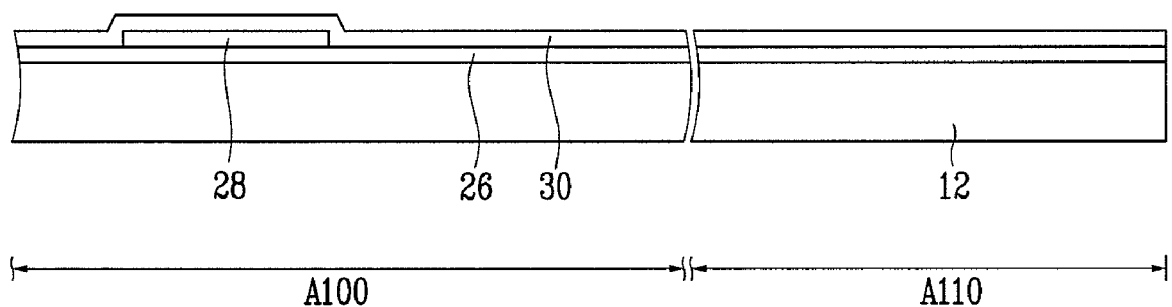

Referring to FIG. 2A, a buffer layer 26 is formed on a front surface of a first substrate 12 including a pixel area A100 and a pad area A110. The buffer layer 26 protects a TFT to be formed in a next stage process against impurities from the first substrate 12. The buffer layer 26 may comprise silicon nitride alone or a laminated layer of silicon nitride and silicon oxide.

Subsequently, an active layer 28 is formed on the buffer layer 26 in the pixel area A100. The active layer 28 may comprise amorphous silicon that is patterned after being deposited and crystallized. Then, a gate insulating layer 30 is formed on the buffer layer 26 covering the active layer 28.

Figure 2B:
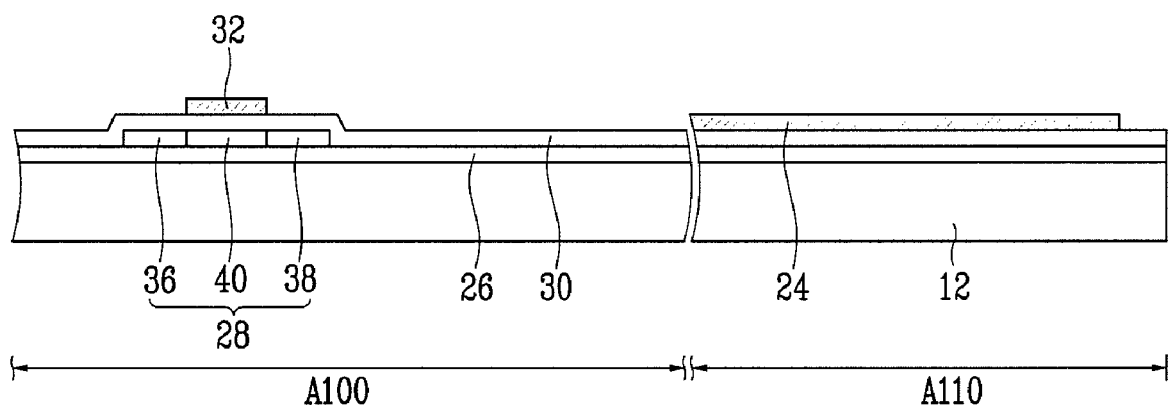
Figure 2G:
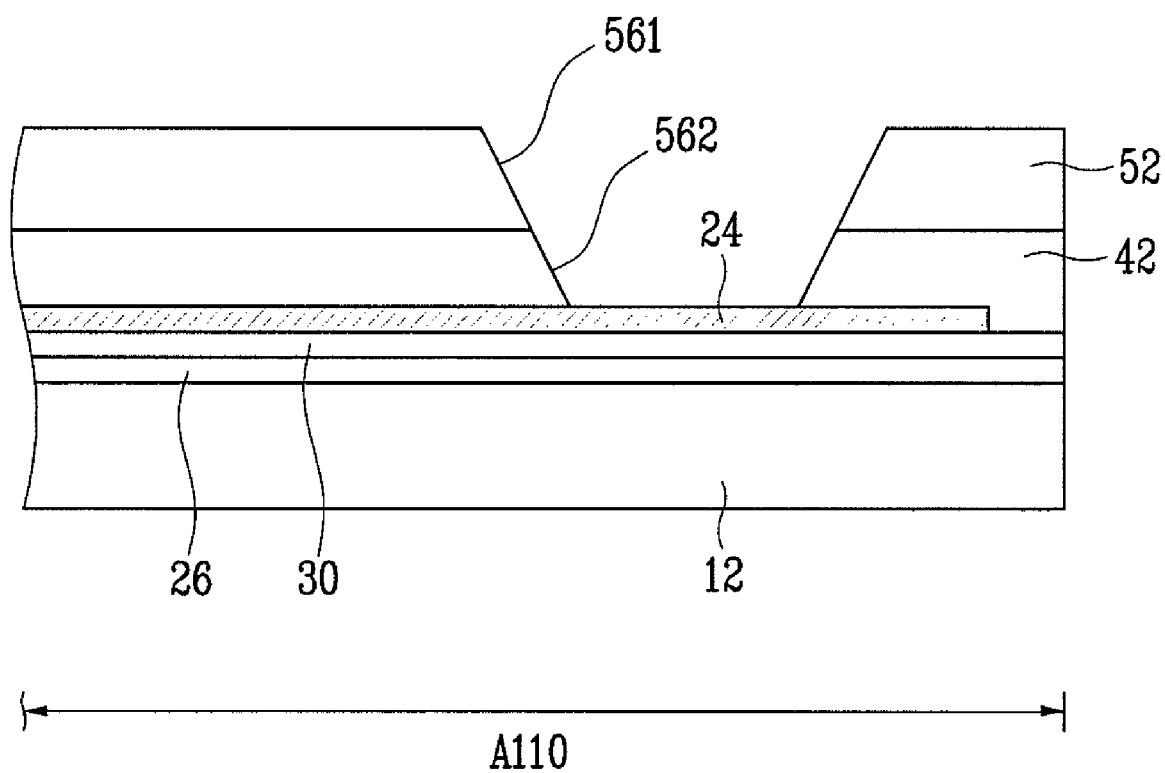

Referring to FIG. 2B, a first conductive layer (not shown) is formed on the gate insulating layer 30, and patterned to form a gate electrode 32 and a pad electrode 24 respectively in the pixel area A100 and the pad area A110. The gate electrode 32 is disposed on the active layer 28. The gate electrode 32 comprises at least one of MoW, Al, Cr, and Al/Cr. The pad electrode 24 may be a gate pad electrode.

The gate electrode 32 is used as a mask to inject impurities into the active layer 28. Thus, a source region 36 and a drain region 38 are formed in the active layer 28. In the active layer 28, a channel region 40 is formed between the source region 36 and the drain region 38.

Referring to FIG. 2C, an interlayer insulating layer 42 is formed on the gate insulating layer 30 covering the gate electrode 32 and the pad electrode 24. The interlayer insulating layer 42 is patterned to form first contact holes 441 and 442 exposing the source region 36 and second contact holes 461 and 462 exposing the drain region 38.

Thereafter, a second conductive layer (not shown) is formed on the interlayer insulating layer 42. The second conductive layer is patterned to form a source electrode 48 connected to the source region 36 and a drain electrode 50 connected to the drain region 38. The source electrode 48 and the drain electrode 50 comprise at least one of Ti, Ti-alloy, Ta, and Ta-alloy. The Ti-alloy may be TiN, and the Ta-alloy may be TaN. According to the aforementioned process, the second TFT T2 is completed.

Referring to FIG. 2D, a planarization layer 52 is formed on the interlayer insulating layer 42 so as to cover the source electrode 48 and the drain electrode 50. The planarization layer 52 may be made of an acrylic layer. In the pixel area A100, the planarization layer 52 is patterned to form a via-hole 54 exposing the drain electrode 50. At the same time, in the pad area A110, the planarization layer 52 and the interlayer insulating layer 42 are patterned to form pad contact holes 561 and 562 exposing the pad electrode 24.

Referring to FIG. 2E, a third conductive layer (not shown) is formed on the planarization layer 52 in the pixel area A100 and the pad area A110, for example, using a sputtering method and/or a vacuum-deposition method. An etching method, in which a mask layer 58 and a third conductive layer etchant are used, patterns the third conductive layer, thereby simultaneously forming a first pixel electrode 60 and a pad protection layer 62. The first pixel electrode 60 is coupled to the drain electrode 50 through the via-hole 54. The pad protection layer 62 is coupled to the pad electrode 24 though the pad contact holes 561 and 562.

The pad protection layer 62 and the first pixel electrode 60 are substantially simultaneously formed from the same material. Thus, in the process of etching the third conductive layer, the pad electrode 24 is not exposed to the third conductive layer etchant due to the pad protection layer 62. Therefore, the pad electrode 24 can be prevented from disconnection which may occur when the pad electrode 24 is damaged by the third conductive layer etchant. Furthermore, in the process of etching the third conductive layer, a galvanic phenomenon does not occur between the pad electrode 24 and the pad protection layer 62.

The first pixel electrode 60 may be an anode and may comprise Ag. The first pixel electrode 60 may be laminated with a first transparent conductive layer, a reflective layer, and a second transparent conductive layer. The first transparent conductive layer and the second transparent conductive layer may comprise indium tin oxide (ITO) or indium zinc oxide (IZO). The reflective layer may comprise Ag or Ag-alloy. The reflective layer enhances reflection efficiency of a light emitting element and improves electric conductivity. The second transparent conductive layer suppresses oxidation of the reflective layer and improves a work function between an organic emission layer to be formed later and the reflective layer.

Referring to FIG. 2F, a pixel-defining layer 64 is formed on the planarization layer 52 in the pixel area A100 covering the first pixel electrode 60. The pixel-defining layer 64 is patterned to form an opening 66 exposing the first pixel electrode 60. Subsequently, an organic emission layer 68 is formed on the first pixel electrode 60. The organic emission layer 68 may include a hole injection layer (HIL), a hole transport layer (HTL), an electron injection layer (EIL), and an electron transport layer (ETL). Then, a second pixel electrode 70 is formed on the organic emission layer 68 across the entire pixel area A100, thereby completing the light emitting element L1.

Next, the sealant 14 (see FIG. 1) is applied on the first substrate 12 and/or the second substrate 16 (see FIG. 1), and the first substrate 12 and the second substrate 16 are assembled. The sealant 14 is melt and hardened thereby bonding the first substrate 12 and the second substrate 16. The sealant 14 protects the pixel area A100 against external oxygen or moisture. Subsequently, on the second substrate 16, an upper portion of the pad area A110 is removed, thereby exposing the pad area A110.

Referring to FIG. 2G, the pad protective layer 62 is removed by spraying a third conductive layer etchant onto the pad area A110 or by using a wet etching method in which the pad area A110 is immersed into the third conductive layer etchant, thereby exposing the pad electrode 24. Subsequently, by utilizing a tape carrier package (TCP) bonding method or the like, an external module (not shown) is mounted on the pad electrode 24, thereby completing the OLED display.

The pad protective layer 62 comprises the same conductive material as the first pixel electrode 60. Thus, the external module can be mounted on the pad protection layer 62 without having to remove the pad protective layer 62. However, since the pad protective layer 62 contains Ag which has a low tolerance in a reliability test in terms of high temperature, high moisture, and high temperature operations, electrical corrosion may occur, resulting in a line defect. In the present embodiment, the pad protective layer 62 is completely removed before the external module is mounted, and thus the problem of electrical corrosion of Ag can be solved.

Meanwhile, an individual OLED display may be manufactured such that a plurality of pixel areas A100 and a plurality of pad areas A110 are simultaneously formed on the first substrate 12, the first substrate 12 is then bonded with the second substrate 16, and the bonded substrate is then separated. In this case, the pad protection layer 62 may be removed by simultaneously spraying an etchant onto a plurality of OLED displays or by simultaneously immersing the plurality of OLED displays into the etchant. Accordingly, manufacturing efficiency can be enhanced.

Hereinafter, a method of manufacturing an OLED display according to a second embodiment will be described with reference to FIGS. 3A to 3C, which are cross sectional views. In the OLED display of the second embodiment, a pad electrode is disposed in a different position from the first embodiment. The same reference numbers will be used throughout the drawings to refer to the same elements as in the first embodiment.

Figure 3A:
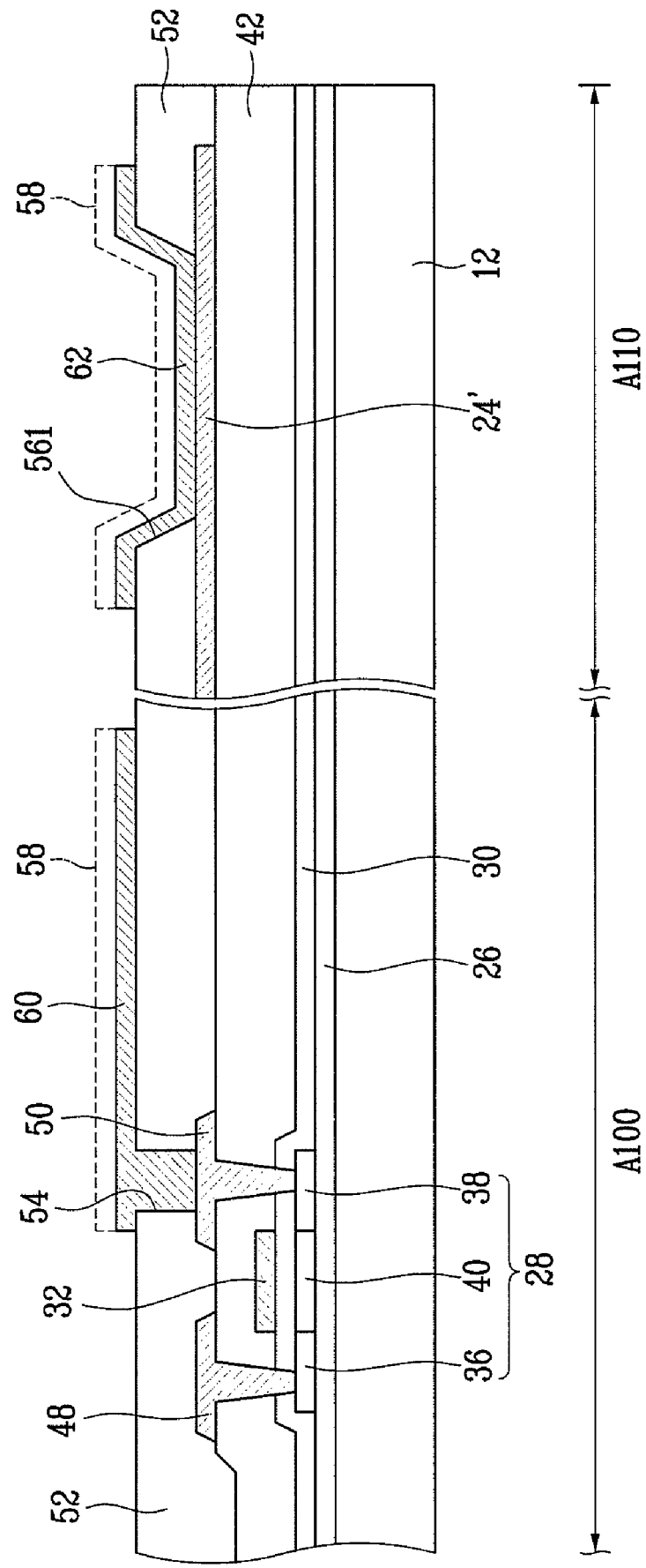
FIGS. 3A to 3C are cross-sectional views of a method of manufacturing an OLED display according to a second embodiment.

Referring to FIG. 3A, in the same manner as described in the first embodiment, a buffer layer 26, an active layer 28 including a source region 36, a drain region 38, and a channel region 40, a gate insulating layer 30, and an interlayer insulating layer 42 are formed on a first substrate 12. A second conductive layer is formed on the interlayer insulating layer 42. The second conductive layer is patterned to form a source electrode 48 and a drain electrode 50. At substantially the same time, a pad electrode 24' is formed in a pad area A110.

The source electrode 48, the drain electrode 50, and the pad electrode 24' comprise any one of Ti, Ti-alloy, Ta, and Ta-alloy. The Ti-alloy may be TiN, and the Ta-alloy may be TaN. The pad electrode 24' may be a data pad electrode.

Subsequently, a planarization layer 52 is formed on the interlayer insulating layer 42 covering the source electrode 48, the drain electrode 50, and the pad electrode 24'. The planarization layer 52 is patterned to form a via-hole 54 exposing the drain electrode 50 and a pad contact hole 561 exposing the pad electrode 24'.

Then, a third conductive layer (not shown) is formed on the planarization layer 52 in a pixel area A100 and the pad area A110 in the same manner as described in the first embodiment. Thereafter, the third conductive layer is patterned to form a first pixel electrode 60 connected to the drain electrode 50 via the via-hole 54 and a pad protection layer 62 connected to the pad electrode 24' via the pad contact hole 561.

Figure 3B:
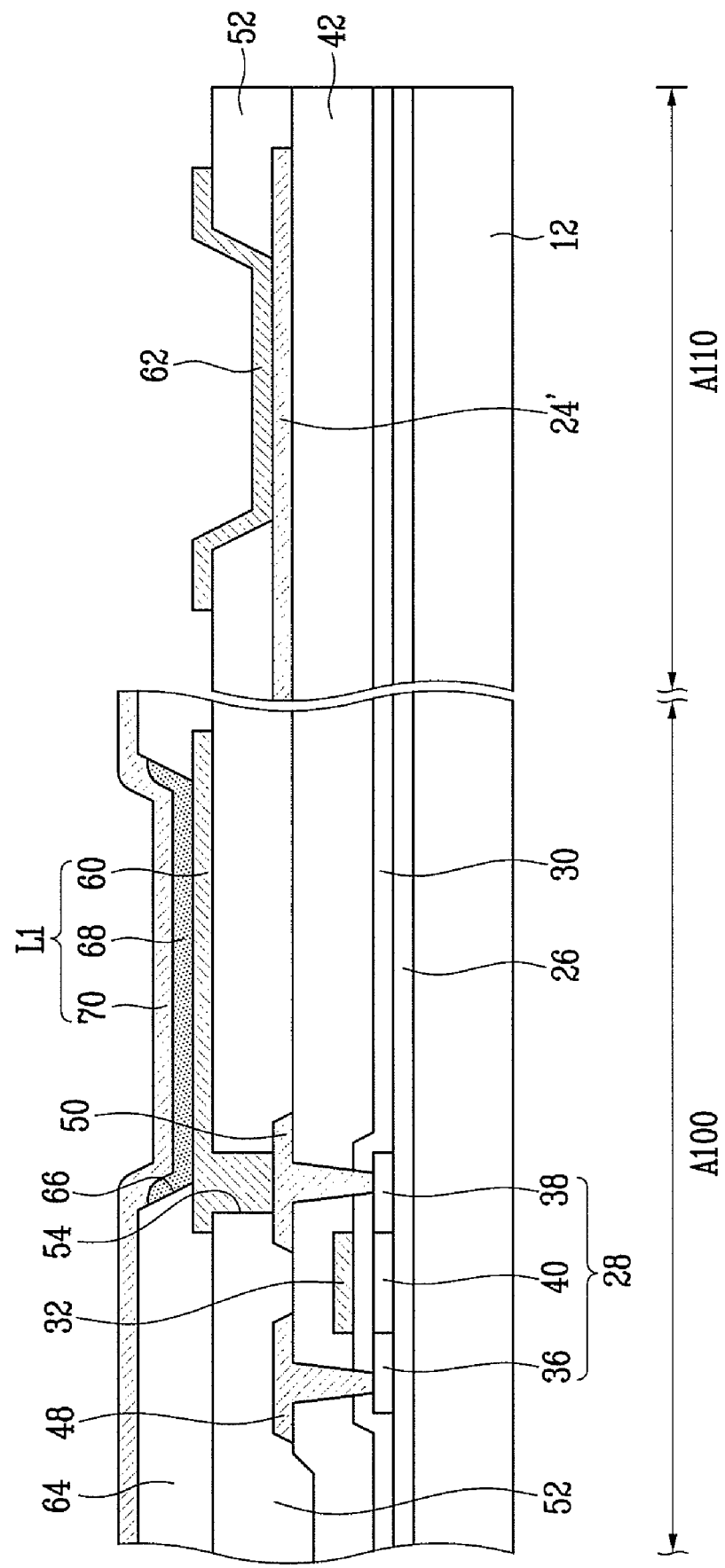
Figure 3C:
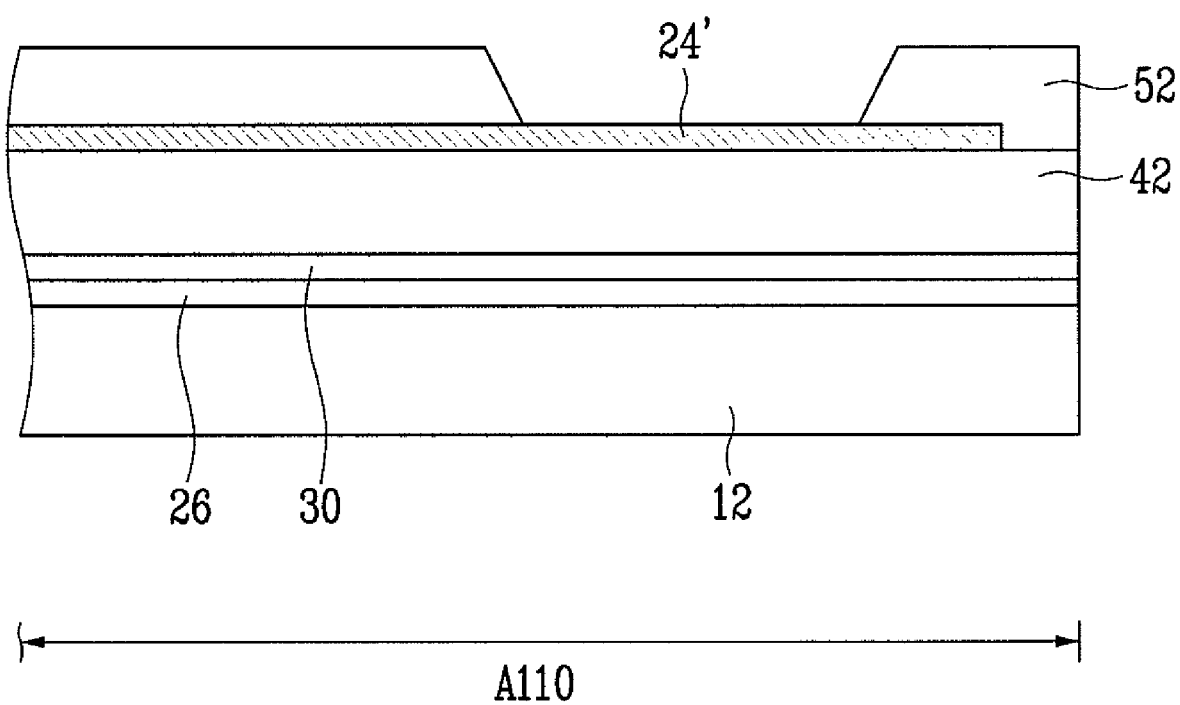

Referring to FIG. 3B, a pixel-defining layer 64 is formed on the planarization layer 52 in the pixel area A100 covering the first pixel electrode 60. The pixel-defining layer 64 is patterned to form an opening 66 exposing the first pixel electrode 60. Then, an organic emission layer 68 is formed on the first pixel electrode 60. A second pixel electrode 70 is formed on the organic emission layer 68 across the entire pixel area A100.

Subsequently, the first substrate 12 is bonded to the second substrate 16 (see FIG. 1). An upper portion of second substrate 16 over the pad area A110 is removed to expose the pad area A110. Then, the pad electrode 24' is exposed by removing the pad protection layer 62 exposed at the pad area A110. An external module is mounted on the pad electrode 24', thereby completing the OLED display.

Because a pad protection layer is formed on a pad electrode when a first pixel electrode is formed, the pad electrode can be protected against damage caused by a first pixel electrode etchant. In addition, since the pad protection layer is removed before an external module is mounted, defects, including line defects, can be prevented when the pad electrode layer is electrically corroded.

Although the exemplary embodiments and the modified examples have been described, the present disclosure is not limited to the embodiments and examples, but may be modified in various forms without departing from the scope of the appended claims, the detailed description, and the accompanying drawings. Therefore, it is natural that such modifications belong to the scope of the present disclosure.

While practical exemplary embodiments have been described herein, the disclosure is not limited to the disclosed embodiments, but, on the contrary, is intended to cover various modifications and equivalent arrangements included within the spirit and scope of the appended claims.

What is claimed is:

1. A method for manufacturing a display device, comprising:
    forming a thin film transistor in a pixel area on a first substrate and simultaneously forming a pad electrode in a pad area on the first substrate;
    forming a first pixel electrode coupled to the thin film transistor and simultaneously forming a pad protection layer covering the pad electrode; and
    exposing the pad electrode by removing the pad protection layer.

2. The method of claim 1, wherein the first pixel electrode comprises Ag.

3. The method of claim 2, wherein the first pixel electrode includes a first transparent conductive layer, a reflective layer, and a second transparent conductive layer, and the reflective layer comprises Ag.

4. The method of claim 1, further comprising forming an organic emission layer and a second pixel electrode on the first pixel electrode.

5. The method of claim 1, further comprising bonding a second substrate onto the first substrate before the pad protection layer is removed.

6. The method of claim 5, wherein the pad protection layer is removed by wet etching.

7. The method of claim 1, wherein forming of the thin film transistor comprises:
    forming sequentially, an active layer, a gate insulating layer, and a gate electrode on the first substrate;
    forming an interlayer insulating layer on the gate insulating layer, covering the gate electrode; and
    forming a source electrode and a drain electrode on the interlayer insulating layer.

8. The method of claim 7, wherein the gate electrode and the pad electrode are substantially simultaneously formed from the same material.

9. The method of claim 8, wherein the pad electrode comprises at least one of MoW, Al, Cr, and Al/Cr.

10. The method of claim 8, further comprising:
    forming a planarization layer on the thin film transistor and the pad electrode;
    forming a via-hole by patterning the planarization layer, thereby exposing the drain electrode; and
    forming a pad contact hole by patterning the planarization layer and the interlayer insulating layer, thereby exposing the pad electrode.

11. The method of claim 7, wherein the source electrode, the drain electrode, and the pad electrode are substantially simultaneously formed from the same material.

12. The method of claim 11, wherein the pad electrode comprises at least one of Ti, Ti-alloy, Ta, and Ta-alloy.

13. The method of claim 12, wherein the Ti-alloy comprises TiN, and the Ta-alloy comprises TaN.

14. The method of claim 11, further comprising:
    forming a planarization layer on the thin film transistor and the pad electrode; and
    forming a via-hole, which exposes the drain electrode, and a pad contact hole, which exposes the pad electrode, by patterning the planarization layer.

15. The method of claim 11, further comprising:
    forming a planarization layer on the thin film transistor and the pad electrode;
    forming a via-hole and a pad contact hole by patterning the planarization layer, wherein the via-hole exposes the drain electrode, and the pad contact hole exposes the pad electrode.

* * * * *